United States Patent [19]

Moeller

[11] Patent Number: 4,768,081
[45] Date of Patent: Aug. 30, 1988

[54] PROCESS FOR ENCAPSULATING MICROELECTRONIC CIRCUITS WITH ORGANIC COMPONENTS

[75] Inventor: Werner Moeller, Ulm, Fed. Rep. of Germany

[73] Assignee: Messerschmitt-Boelkow-Blohm GmbH, Ottobrunn, Fed. Rep. of Germany

[21] Appl. No.: 908,687

[22] PCT Filed: Nov. 18, 1985

[86] PCT No.: PCT/DE85/00473
§ 371 Date: Jul. 16, 1986
§ 102(e) Date: Jul. 16, 1986

[87] PCT Pub. No.: WO86/03056
PCT Pub. Date: May 22, 1986

[30] Foreign Application Priority Data

Nov. 17, 1984 [DE] Fed. Rep. of Germany ....... 3442132

[51] Int. Cl.$^4$ ............................................. H01L 23/28
[52] U.S. Cl. ......................................... 357/72; 357/78; 423/334; 423/338; 252/181.4
[58] Field of Search ................... 357/78, 72; 423/334, 423/338; 252/181.4

[56] References Cited

U.S. PATENT DOCUMENTS

| 3,007,089 | 10/1961 | King. | |
|---|---|---|---|
| 3,181,229 | 5/1965 | Haberecht et al. | 357/78 |
| 3,885,304 | 5/1975 | Kaiser et al. | 357/72 |
| 4,077,899 | 3/1978 | van Gils | 252/181.4 |
| 4,163,072 | 7/1979 | Soos | 357/72 |
| 4,342,662 | 8/1982 | Kimura et al. | 252/181.4 |

FOREIGN PATENT DOCUMENTS

| 56-81956 | 7/1981 | Japan | 357/78 |
|---|---|---|---|
| 60-157241 | 8/1985 | Japan | 357/72 |
| 873916 | 8/1961 | United Kingdom. | |
| 1193610 | 6/1970 | United Kingdom. | |

Primary Examiner—Martin H. Edlow
Assistant Examiner—Gregory A. Key
Attorney, Agent, or Firm—W. G. Fasse; D. H. Kane, Jr.

[57] ABSTRACT

Special absorbers or getters are incorporated in hermetically sealed electronic circuits with organic components, for example, with parylene passivations, silver conductive adhesives, and sealing materials. The getter material, preferably $BaAl_4$, is dispersed as an extremely fine-grained powder in a gas permeable, inert silicone rubber having a composition which varies according to the application. In short- or long-term thermal loading, for example in power hybrid systems, the proposed getters make it possible to intercept any corrosive fission products such as $CO$, $CO_2$, $NO/NO_2$, and water of reaction to avoid premature aging.

5 Claims, 4 Drawing Sheets

PROCESS FOR ENCAPSULATING MICROELECTRONIC CIRCUITS WITH ORGANIC COMPONENTS

FIELD OF THE INVENTION

The invention relates to encapsulated microelectronic circuits or circuit elements with organic components, whereby a getter is incorporated within the inner chamber for absorbing corrosive gases.

DESCRIPTION OF THE PRIOR ART

Due to the practical requirements imposed on such circuits or circuit elements, highly reliable electronic circuits are protected against environmental influences, moisture, $CO_2$, $SO_2$, as well as other corrosive agents by means of hermetic welding or soldering to a metal or ceramic housing. On the other hand, more and more organic materials are being used for passivating, die-bonding, and for a covering against mechanical shocks in the construction of electronic circuits. However, under thermal loading as occurs in hybrid power systems and partially, that is to a smaller extent, in small-signal circuits, a small gas generation must be expected even in thermally stable epoxy-, polyurethane-, and silicone-resins or elastomers of proven reliability in microelectronics. It is known through gas analysis, that the gases involved are mostly $H_2O$, $CO_2$, CO, $NH_3$, and organic acids, which lead to an electrolytic corrosion of aluminum conduction paths and of bond wires, thereby causing failure of the circuit, in hybrid systems to which a voltage is applied. The hereby resulting hydrogen as well as any remaining oxygen increase the corrosion, so that these gases should be removed.

In low power hybrids, these gases partially precipitate as moisture and cause additional electrolysis when a voltage is applied. The formation of aging-, or fission-products may only be prevented to a limited extent in spite of exhaustive efforts in applying processing technology, for example evacuation $N_2$-flushing, or drying. The drying agents used in electronics and known for example from the German Patent Publication (DE-OS) No. 3,112,564 or the molecular sieves based on zeolith, the use of which is known, for example from European Patent Publication (EP-Al) No. 0,113,282, only absorb the moisture and again release the moisture when the circuit is heated, that is under critical switching or operating conditions.

Furthermore, it is suggested, for example in European Patent Publication (EP-A2) No. 0,025,647, to only use partially cross-linked silicone rubber as a getter or as a collector for dust particles. A dust collector obviously does not work as a gas getter and does not absorb moisture.

More suitable are highly active getter materials, which are distributed by vaporization to provide large surface areas, and which irreversibly intercept any reactive gases, perhaps maintain the vacuum stabile and prevent any gas reaction.

Such highly active getters were developed for electron beam tubes for absorbing corrosive gases and moisture traces. Preferably used for this purpose are alkaline earth-, and zirconium metal-, and zirconium hydride-rods, which are vaporized and which, when heated, react more or less strongly with the resulting fission gases, corresponding to barium, in the following reactions.

| | |
|---|---|
| $2\,Ba + H_2O =$ | $Ba\,H_2 + Ba\,O$ |
| $5\,Ba + 2\,CO_2 =$ | $Ba\,C_2 + 4\,Ba\,O$ |
| $3\,Ba + CO =$ | $Ba\,C_2 + 2\,Ba\,O$ |
| $2\,Ba + 2\,NH_3 =$ | $Ba\,H_2 + Ba\,(NH_2)_2$ |
| $2\,Ba + 2\,R\text{---}COOH =$ | $Ba\,(R\text{---}COO)_2 + Ba\,H_2$ |
| $Ba + H_2 =$ | $Ba\,H_2$ |

Extremely fine grained $BaAl_4$ getters appear, at first, to be especially suited for use as the organic materials or the resulting fission gases used in electronic circuits, because such getters are inert relative to "kovar" or chrome-nickel steel and are relatively stable with respect to nitrogen, but absorb or chemically absorb all remaining gases. However, a vaporization of the getter in a small housing is difficult.

OBJECT OF THE INVENTION

It is the aim of the invention to provide processes and materials suitable for carrying out these processes, which make it possible for a getter to reliably render harmless the corrosive gases and interfering moisture even in small electronic circuits which are to be encapsulated.

SUMMARY OF THE INVENTION

This aim is achieved according to the invention in that the getter material is dispersed as an extremely fine-grained powder in a gas permeable inert silicone rubber.

Achieving the above named aim therefore entails dispersing highly active, yet non-critically processable getters in an extremely fine-grained distribution in a gas permeable, inert (with respect to the getter, the gas, and the circuit), high purity carrier. Tests have determined that, on the one hand barium-aluminum alloys, and on the other hand low-viscosity, highly pure, thermally stable, slightly additively cross-linking two-component silicone gels satisfy these requirements and may be mixed as desired. In a differential thermoanalytic technique (DSC2), no reaction could be achieved if no moisture was allowed to interact. A slow reaction determined by the diffusion velocity only starts when heat is applied, so that the getter is first activated during welding-in and during operation.

BRIEF DESCRIPTION OF THE DRAWINGS

In order that the invention may be clearly understood, it will now be described, by way of example, with reference to the accompanying drawings, wherein.

DETAILED DESCRIPTION OF PREFERRED EXAMPLE EMBODIMENTS AND OF THE BEST MODE OF THE INVENTION

Figure 1A:
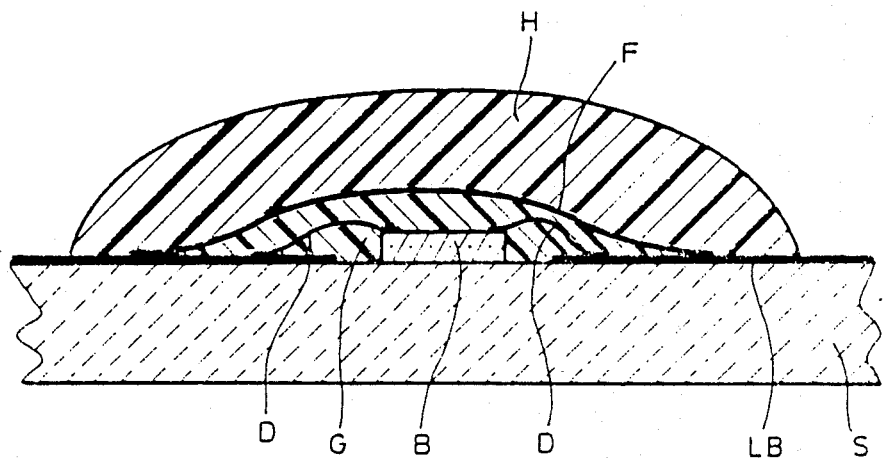
FIGS. 1a to d show the structure of various forms of circuits encapsulated by the process according to the invention.

FIGS. 1a to 1d show the basic structure of a circuit encapsulated by the process according to the invention. In FIG. 1a, a microelectronic component block B, which is, for example, passivated with $Si_3N_4$, adheres to a substrate S, which, for instance, comprises $Al_2O_3$. The component block B is electrically connected to the conductor paths LB in a known manner by bond wires D, which are made of, for example, gold or other highly conductive metal. The component block B and the bond wires are located within a soft synthetic layer G, which comprises a silicone gel with a $BaAl_4$ filling. The layer G is covered by a film F comprising a metal layer. Finally, the entire structure is encapsulated with epoxy resin H with an $SiO_2$ filling.

The soft synthetic layer G on the one hand serves as a mechanical padding of the component blocks and bond wires, and on the other hand it also serves as a carrier for the getter material. For this reason, it comprises a material of the type initially described above and further specified in the example embodiment.

Figure 1B:
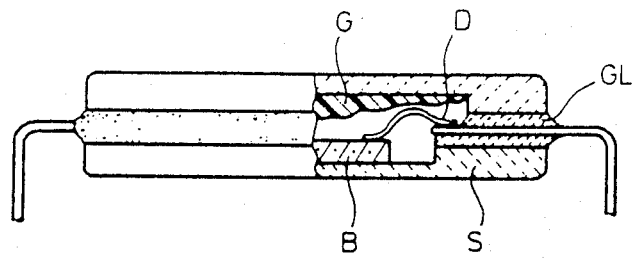
Figure 1C:
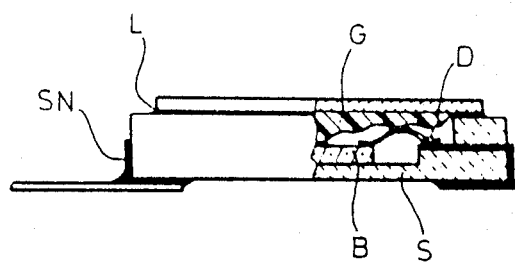
Figure 1D:
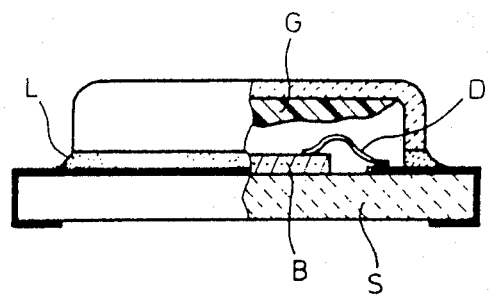

It is to be understood that the process according to the invention may also be used for housings of a rigid material (FIGS. 1b to 1d).

FIGS. 1a to 1d show known structures having rigid housings. Thereby FIG. 1b shows a widely known plastic or ceramic housing. The embodiments of FIGS. 1c to 1d show metal or ceramic housings.

The two halves of the housing of FIG. 1b are, for example, connected by glass GL. The housings according to FIGS. 1c and 1d are welded by weld beads SN or soldered by solder points L. It is common to all of these structures, that the existing empty inner space is at least partially filled with the getter material according to the invention.

Figure 2:
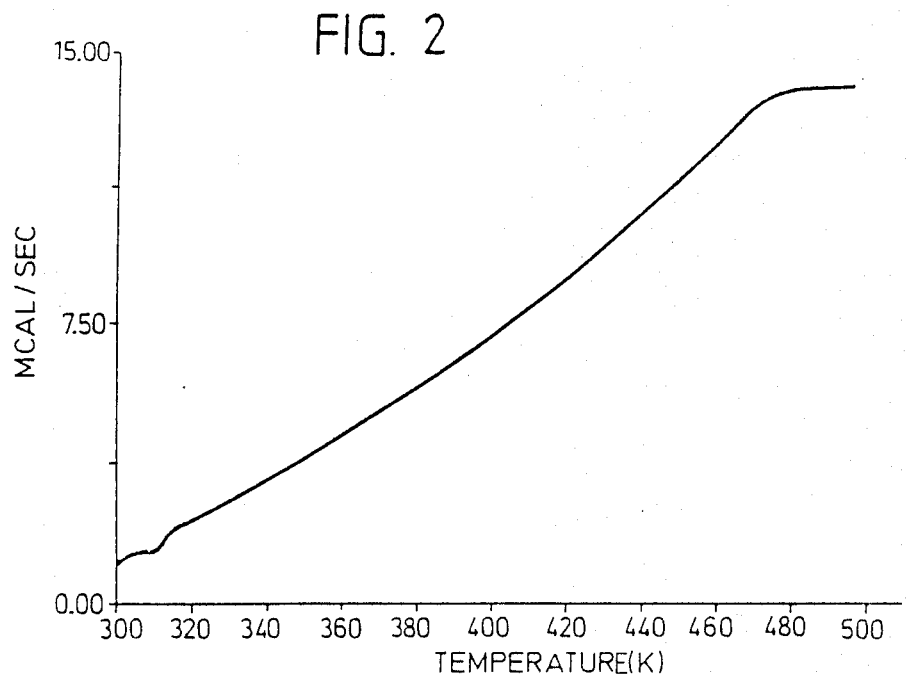
FIG. 2 is a differential thermoanalytic diagram for a silicone gel without getter material.
Figure 3:
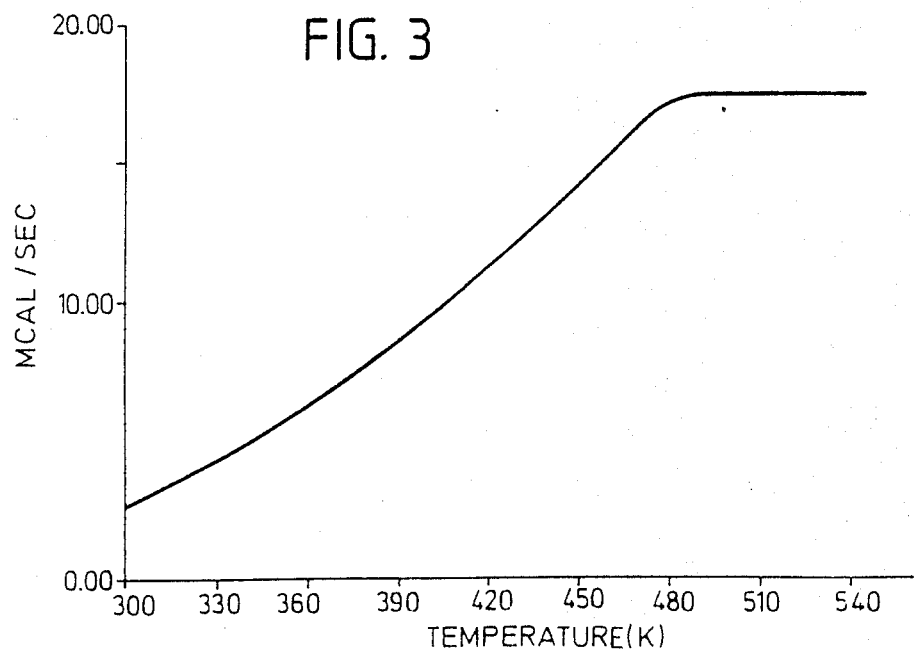
FIG. 3 is a differential thermoanalytic diagram for a silicone gel with $BaAl_4$ in air.
Figure 4:
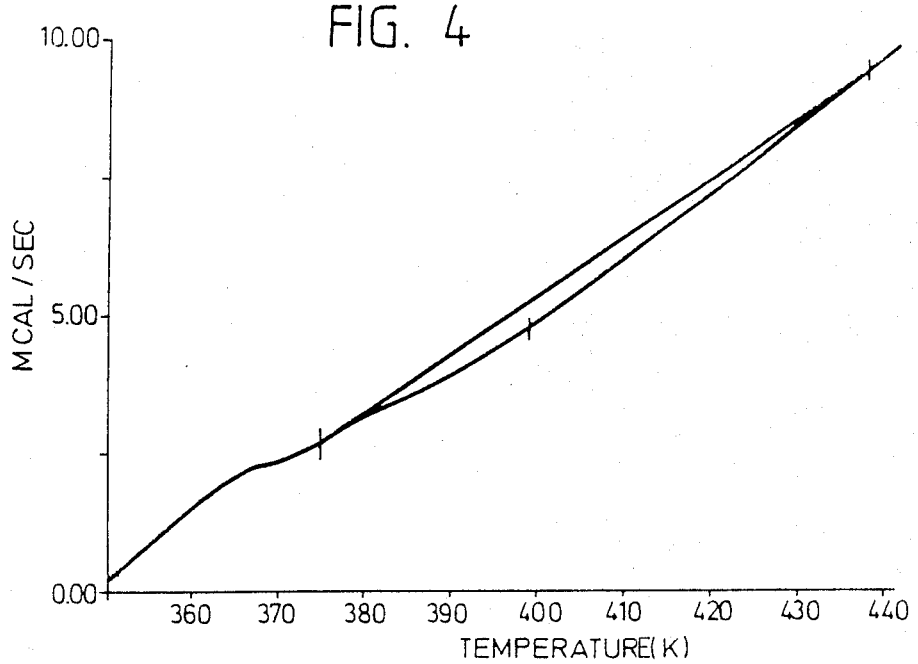
FIG. 4 is a differential thermoanalytic diagram for a silicone gel with $BaAl_4$ in air with moisture.

FIGS. 2 to 4 show differential thermoanalytic diagrams for a silicone gel as a carrier material and $BaAl_4$ as a getter material. All of the thermoanalyses were made with $\Delta T/\Delta t = $ constant, and equivalent test quantities and conditions were employed in each instance.

With regard to the interpretation of the diagrams it is to be noted that the vertical axis or ordinate depicts the heat evolution or change in mcal/sec. Temperatures in °K. are registered on the abscissa. A linearly extending curve indicates that the heat flow is constant and no heat of reaction or heat of transformation arises, dips indicate that heat is released in this region, for example through reaction of the getter with the moisture.

FIG. 2 shows a differential thermoanalytic diagram for a silicone gel without a getter material. A heat evolution is not recognizable.

FIG. 3 shows a differential thermoanalytic diagram for a silicone gel with $BaAl_4$ in air. A slight heat evolution is practically not recognizable.

FIG. 4 shows a differential thermoanalytic diagram for a silicone gel with $BaAl_4$ in air with moisture. The heat evolution in the range from 380° K. to 440° K. is easily recognizable.

Figure 5:
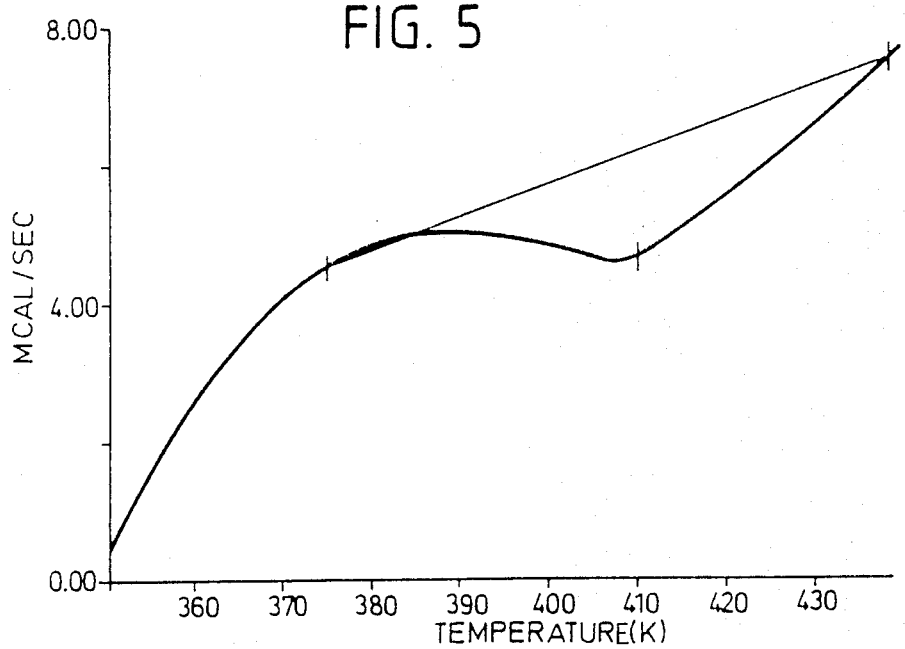
FIG. 5 is a differential thermoanalytic diagram for a silicone gel with $BaAl_4$ in a humid environment.

FIG. 5 shows a differential thermoanalytic diagram for a silicone gel with $BaAl_4$ in a dampened or humid environment. The heat evolution in the range from 380° K. to 440° K. is sharply defined.

In the tests of FIGS. 4 and 5, a fresh mixture was used

In the following, three example embodiments will be described.

EXAMPLE 1

1 g Sil-gel-604 (producer: Wacker) with the components A and B present in a ratio of 9:1 and 3 g barium-aluminum alloy having a medium grain size of $X \leq 40$ $\mu m$ are mixed under a dry nitrogen stream, degasified under $10^{-2}$ torr at $23° \pm 3°$ for 5 minutes to form a getter paste which is immediately used. The housing cover is brushed with a thin layer, approximately 5 to 10 mg/cm² of the getter paste. In approximately 1–2 hours at room temperature or in approximately 5 minutes at 100°, the getter is adhesively vulcanized.

EXAMPLE 2

The Sil-gel-604 components A and B are mixed in a ratio of 15:1. Otherwise the conditions are as in Example 1. Due to the hardness deficiency, the getter remains more gas permeable and stickier. It behaves as a dust getter or rather for intercepting interfering particles.

EXAMPLE 3

Instead of Sil-gel-604, Sil-gel-600 and 601 are used. The Silgel-600 and 601 are vulcanized in the heat so that the getter is already activated. It is to be understood that similar products of other origin can be substituted, for example, the DOW CORNING types:

R-4-3117
XR-90-714 (721)
Q1-9205 (AI-9214)
Q3-6527 A and B

Instead of $BaAl_4$, zirconium metal and zirconium hydride are used as a fine grained powder, whereby a more stable gas getter is obtained.

Although the invention has been described with reference to specific example embodiments, it will be appreciated, that it is intended to cover all modifications and equivalents within the scope of the appended claims.

I claim:

1. A microelectronic component, comprising a housing and an extremely fine grained powder mixture of zirconium metal and zirconium hydride dispersed as a getter material in a gas permeable inert silicone rubber in said housing for binding corrosive gases.

2. The microelectronic component of claim 1, wherein said extremely fine grained powder has a grain size within the range of 0.1 to 100 micron.

3. The microelectronic component of claim 2, wherein said grain size is within the range of 5 to 50 micron.

4. The microelectronic component of claim 1, wherein said silicone rubber is substantially ion-free having and ion concentration of <50 ppm, which is weakly cross-linkable, and having a high gas permeation coefficient, said silicone rubber further being inert to said zirconium metal and zirconium hydride and to any circuit elements in said housing.

5. The microelectronic component of claim 4, wherein said silicone rubber is a silicone gel.

* * * * *